United States Patent [19]

Skutta

[11] 4,115,741
[45] Sep. 19, 1978

[54] FAST ATTACK AUTOMATIC GAIN CONTROL CIRCUIT

[75] Inventor: Frank Robert Skutta, Arlington Heights, Ill.

[73] Assignee: Motorola, Inc., Schaumburg, Ill.

[21] Appl. No.: 820,668

[22] Filed: Aug. 1, 1977

Related U.S. Application Data

[63] Continuation of Ser. No. 679,413, Apr. 22, 1976, abandoned.

[51] Int. Cl.$^2$ .............................................. H03G 3/10
[52] U.S. Cl. .................................. 330/284; 325/413; 330/145; 330/279
[58] Field of Search ........................ 325/402, 410, 413; 330/145, 279, 281, 284

[56] References Cited

U.S. PATENT DOCUMENTS

| | | | |
|---|---|---|---|
| 3,169,229 | 2/1965 | Ulzurrun | 330/279 |
| 3,408,588 | 10/1968 | Rugo | 330/284 X |
| 3,895,310 | 7/1975 | Warren | 330/145 |

Primary Examiner—Lawrence J. Dahl
Attorney, Agent, or Firm—James P. Hamley; James W. Gillman

[57] ABSTRACT

The improved gain control circuit is comprised of an amplifier, a semiconductor device attenuator at the amplifier input, and unique control circuitry for controlling the attenuation factor of the semiconductor device. The amplifier is designed for low phase shift to minimize the time delay of its transfer function. The control circuitry responds to both positive and negative a.c. signal transitions at the amplifier output to initiate attenuator gain reduction. As with the amplifier, the control circuitry is designed for minimum response time. The combination results in an extremely fast a.g.c. attack time.

8 Claims, 2 Drawing Figures

FAST ATTACK AUTOMATIC GAIN CONTROL CIRCUIT

This is a continuation of application Ser. No. 679,413, filed Apr. 22, 1976, now abandoned.

BACKGROUND OF THE INVENTION

The present invention pertains to the amplifier art and, more particularly, to an amplifying system having a quick responding automatic gain control.

Automatic gain control circuits are well known in the electronics art. Such circuits are commonly used in applications wherein a requirement is that an a.c. signal level be constrained within defined limits. For example, the communications art often requires that the dynamic range of audio information signals be compressed to minimize overloading of the transmitted signal while maintaining the average audio modulation at a high index and, thereby, increase the effective radiation area of the transmitter.

A substantial problem in many applications for audio gain control circuits is that conventional circuits do not have a quick response, or attack time. Attack time is that time necessary for the gain control circuit to attenuate a high level input signal to a desired level. This problem is particularly acute in single sideband transmitters wherein a slow attack time can result in clipping of the audio signal due to amplifier stage overloading. In fact, some circuits intentionally provide a clipper to prevent this overload condition. This clipping leads to loss of intelligibility of the transmitted information.

SUMMARY OF THE INVENTION

It is an object of this invention, therefore, to provide an improved automatic gain control circuit which exhibits an extremely rapid attack time.

Briefly, according to the invention, the automatic gain control circuit comprises an amplifier, an attenuator, and control means. The amplifier has an input for receiving a.c. signals and an output whereat the amplifier reproduces the received a.c. signals. It is preferable that the transfer characteristic of the amplifier exhibit a very low phase shift, thus reproducing signals at its output with a minimum time delay. The attenuator couples to the input of the amplifier and, in response to control signals, attenuates signals thereat. Semiconductor devices, such as field effect transistors, are excellent in this application. The control means is unique in that it couples to the output of the amplifier and responds to both the positive and negative peak transitions of the a.c. signal thereat to produce a predetermined control signal for varying the attenuation factor of the attenuator. In common application, the control means includes a means for determining whether the peak level of the a.c. signals at the amplifier output exceed a predetermined threshold level and, if so, increase the attenuation factor of the attenuator.

DESCRIPTION OF THE PREFERRED EMBODIMENT OF THE INVENTION

Figure 1:
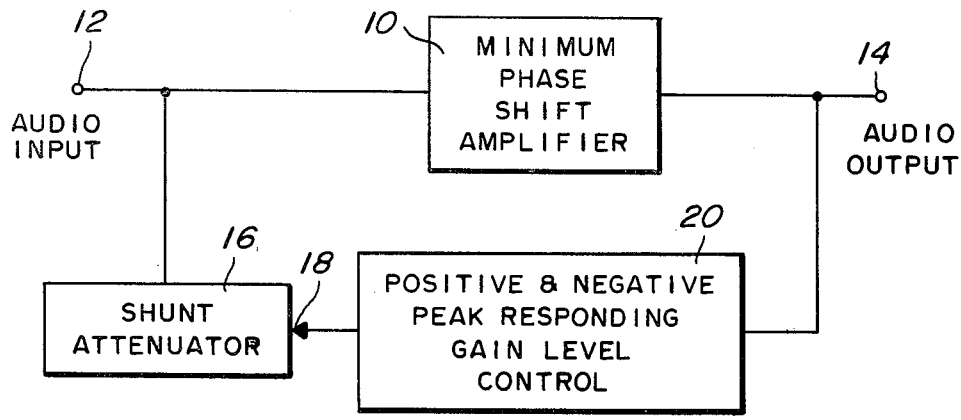
FIG. 1 illustrates, in block diagram form, a generalized system according to the instant invention.

Referring to FIG. 1, the improved fast attack automatic gain control circuit includes an amplifier 10 provided with an input terminal 12 for receiving a.c. signals and an output terminal 14 for reproducing the a.c. signals thereat. The amplifier 10 is designed to have a low phase shift transfer characteristic such that signals at the input 12 are reproduced at the output 14 with a minimum time delay. A shunt attenuator 16 couples between the audio input terminal 12 of the amplifier 10 and a reference point of low a.c. impedance, such as ground potential. The attenuator 16 responds to signals at its control signal input 18 to vary its attenuation factor, whereby the level of signals applied at the amplifier input terminal 12 may be controlled.

Coupled between the audio output terminal 14 of the amplifier 10, and the control signal input terminal 18 of the attenuator 16 is a gain control circuit 20. The gain level control circuit responds to both positive and negative peak transitions of the a.c. signals at the audio output terminal 14 to produce a control signal for application to the control signal input 18 of the shunt attenuator 16. The gain level control circuit 20 is designed to exhibit a minimum time delay between sensing the peak level of the a.c. signals at the audio output and generating a corresponding control signal.

In operation, when the audio input signal makes a transition from a low level to a high level the gain level control circuit 20 senses this transition and applies an appropriate control signal to the shunt attenuator 16 whereby the a.c. signal at the input is appropriately attenuated. Due to the low phase shift of the amplifier 10 and the fast transfer characteristic of the gain level control 20 the input signal may be quickly gain controlled to minimize or eliminate amplifier 10 clipping.

In a large number of applications it is preferable that the gain level control circuit 12 include threshold circuitry for increasing the attenuation factor of the shunt attenuator 16 only for peak a.c. signals at terminal 14 whose level exceeds a predetermined threshold level.

Figure 2:
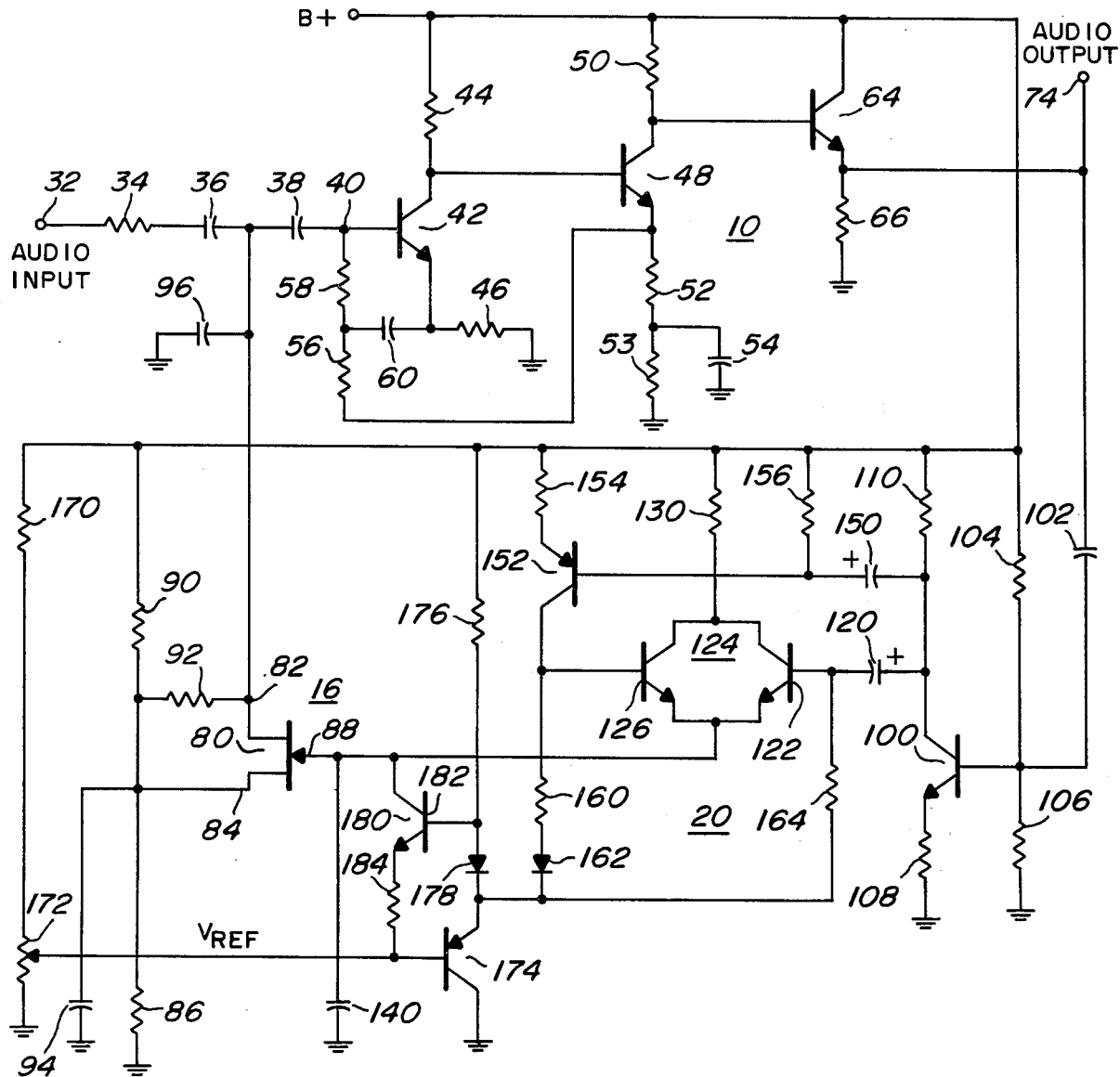
FIG. 2 is a schematic diagram of the preferred embodiment of the invention.

FIG. 2 is a detailed schematic diagram of a preferred embodiment of the gain control system. Audio signals are applied at an audio input terminal 32, which corresponds to the audio input terminal 12 of FIG. 1. These signals are thereafter coupled through a resistor 34 and a pair of coupling capacitors 36, 38 to the base terminal 40 of an NPN transistor amplifying stage 42. The amplifying stage 42 is of the common emitter configuration thus providing amplified signals across its output load resistor 44. The emitter of the NPN transistor stage 42 couples to ground potential through an emitter resistor 46.

The output from stage 42 couples to the base of a second common emitter stage 48. Second amplifying stage 48 includes a collector resistor 50 and a pair of emitter resistors 52, 53. In a well known manner, the second emitter resistor 53 is a.c. bypassed by a bypass capacitor 54 which increases the effective a.c. gain of the stage. DC feedback from the emitter of stage 48 to the base of first amplifying stage 42 is provided by series connected resistors 56, 58. Positive a.c. feedback is provided from the emitter to the base of stage 42 by a coupling capacitor 60. The output of the second amplifying stage 48 is buffered through an emitter follower stage 64, with its output provided across emitter resistor 66. All of the stages of the amplifier are biased from a source of DC potential B+.

The provided output terminal 74, which corresponds to audio output terminal 14 of FIG. 1, from the final amplifying stage 64 reproduces thereat amplified signals received at the audio input terminal 32. By the use of DC coupling between stages, the choice of a large bypass capacitor 54, as well as a large coupling capacitor 38 the amplifier 10 exhibits minimum phase shift such that signals at the amplifier input 32 are transferred to the amplifier output 74 with a minimum time delay.

Coupled to the input terminal 32 of the amplifier 10 is a shunt attenuator 16 which is comprised of a semiconductor junction field effect transistor (FET) 80. The field effect transistor has a drain terminal 82 which couples to the audio input terminal 32 and a source terminal 84 which couples to a voltage divider comprised of resistors 86 and 90. The field effect transistor 80 responds to control signals at its gate 88 to predeterminedly change its drain 82 to source 84 resistance. The drain to source resistance is dependent on, as is well known in the art, the gate 88 to source 84 voltage. For gate to source voltages more negative than a minimum, or "pinch" voltage of the FET the drain to source resistance is quite large. For increasing voltages above the pinch voltage of the FET the resistance from drain to source decreases in an almost linear manner until levelling off at a constant current value. The source voltage of the FET is determined by a voltage divider comprised of the series connection of resistors 90 and 86. A low a.c. impedance to ground at this point is provided by a bypass capacitor 94. DC bias to the drain 82 is established also via this divider through a bias resistor 92. The drain is RF bypassed by bypass capacitor 96.

Coupling between the audio output terminal 74 and the control input, or gate 88 of the attenuator 16 is the gain level control 20. The a.c. signals at the audio output 74 are coupled to an amplifier stage 100 via a high value coupling capacitor 102. Amplifying stage 100 is comprised of an NPN transistor biased via bias resistors 104, 106, emitter resistor 108, and load resistor 110 in a common emitter configuration. The collector of amplifying stage 100 couples through a first coupling capacitor 120 to the first transistor 122 of a two transistor switch 124, having a second transistor 126 wired in parallel with the first transistor 122. The common collector connection of the switch 124 couples to B+ potential through a current limit resistor 130. The common emitter connection of the switch 124 connects to an integrating capacitor 140, whose remaining lead couples to ground potential. Activation of either transistor 122 or 126 causes charge to build up on capacitor 140 via the resistor 130. This charge creates a voltage which is the control signal applied to the gate 88 of the field effect transistor 80. A second coupling capacitor 150 couples from the collector of amplifying stage 100 to an inverter stage 152. Inverter stage 152 is comprised of a PNP transistor having its emitter and base terminals coupled to B+ potential via resistors 154, 156 respectively. The collector terminal of inverter stage 152 couples to the base input of the second transistor 126 in the switch 124, as well as through a load resistor 160 and bias diode 162 to form a common connection with a resistor 164 which couples to the first transistor 122 of switch 124.

A voltage divider comprised of the series connection of a resistor 170 with a potentiometer 172 couples between B+ and ground potential. The tap on the potentiometer 172 connects to the base of a PNP transistor stage 174 connected as a current source. The collector of the PNP current source stage 174 connects to ground potential, with the emitter coupling to B+ through a series connected load resistor 176 and bias diode 178. The base to emitter drop of transistor stage 174, along with the cathode to anode drop of diode 178 provide a constant voltage which biases a current sink stage 180. Current sink stage 180 is comprised of an NPN transistor 182 whose base and emitter connect through a current limit resistor 184 across the diode 178 and base-emitter of transistor 174.

Operation of the gain control system may be understood as follows. In its quiescent state, that is, with no a.c. signal applied, the center tap of potentiometer 172 is adjusted to a predetermined reference voltage ($V_{ref}$). The $V_{ref}$ voltage is reflected through the emitter follower stage 174 to produce a constant current through resistor 176 and diode 178. The voltage appearing at the anode of diode 178 is equal to $V_{ref}$ plus the base to emitter voltage of transistor 174 and the forward bias voltage of diode 178. For silicon devices, the drop across both the aforementioned semiconductor junctions is approximately 0.65 volts, whereby the base of transistor 182 is biased at $V_{ref}$ plus 1.3 volts. Both of the switch transistors 122, 126 are biased to an off stage such that there is no positive bias applied to the collector of the transistor 182. Hence, the base to collector junction of transistor 182 is forward biased with trickles current into the integrating capacitor 140. Capacitor 140 charges to the voltage on the collector of transistor 182 which equals $V_{ref}$ plus 1.3 volts − 0.65 volts or $V_{ref}$ plus 0.65 volts. This voltage is maintained on the capacitor under the quiescent condition.

The value of $V_{ref}$ plus 0.65 is chosen in conjunction with the voltage at the source of the FET attenuator 80 to set the quiescent gate to source voltage on the FET. In the present application the field effect transistor is biased just above its pinch voltage such that the source to drain impedance of the FET is quite high thus providing little attenuation to a.c. signals at the audio input of the amplifier 10. By varying the quiescent gate to source voltage one can set the a.c. signal level at which the system will attack. Thus, adjustment of potentiometer 172 provides a means to set the threshold level at which attack initiates.

In the dynamic condition, that is with an a.c. signal appearing at the audio output 74 of the amplifier 10, the system reacts as follows. A negative transition of the a.c. signal at the audio output 74 causes a corresponding positive transition in voltage swing at the collector of the amplifying stage 100. This positive transition is coupled through capacitor 120 to the base of transistor 122. Prior to receiving the a.c. signal the base of transistor 122 is at $V_{ref}$ plus the 0.65 volts through the emitter base junction of transistor 174. The emitter of transistor 122 is at $V_{ref}$ plus 0.65 as is discussed above. Thus, both the base and emitter of transistor 122 are at the same potential in the quiescent condition. Since it takes approximately 0.65 volts from base to emitter to turn transistor 122 on, the peak transition swing to 120 must exceed this voltage for the transistor to conduct. If the peak swing is above 0.65 volts transistor 122 is turned on whereby current flows through current limiting resistor 130 and transistor 122 to charge capacitor 140. If the charge on capacitor 140 generates a gate voltage on the field effect transistor 80 sufficient to bias the field effect transistor more positive than its pinch voltage, its drain to source resistance will decrease whereby signals at the input to the audio amplifier 10 will be attenuated.

For positive signal swings at the audio output 74 a corresponding negative transition occurs in the collector of the amplifying stage 100. This negative swing is coupled through capacitor 150 and applied to the base of inverting stage 152. Since it is preferable for the same a.c. signal level to occur at the base of each of the switching transistors 122, 126 the gain of the inverter stage is set to −1 by choosing collector load resistor 160 to have the same value as emitter resistor 154. In its quiescent state, the base of transistor 126 is floating since transistor 152 is nonconducting. To assure that transistor 126 turns on at the same peak level as does transistor 122, i.e. at voltages above 0.65 volts, the diode 162 is added in series with the collector load resistor 160. With diode 162, the base to emitter voltage of transistor 126 must rise 0.65 volts before the transistor 126 conducts, as was required with transistor 122.

Current limiting resistor 130 is chosen to limit the rate of charging of capacitor 140, thus preventing overshoot of the attenuation of attenuator 16 as would otherwise occur if the collectors of the switch transistors 122, 126 were connected directly to B+ voltage.

Due to the careful selection of components, therefore, this system reacts in the same manner on the first peak swing of an audio output signal, whether it be a positive or negative transition, to cause appropriate automatic gain control. In addition, by designing the amplifier 10 with a low phase shift, as well as maximizing the transition time of the gain level control 20 the system responds precisely to gain reduce a.c. levels before they are clipped. Not only does clipping cause high distortion in the audio output signal, but it also drives gain stages of the amplifier 10, such as transistor 42 and transistor 48, into saturation. This has two effects. First, the DC voltages on coupling capacitors are changed, and second, once driven into saturation it takes a while for a transistor to recover to its active region. The net result of these two effects is a slow system attack time.

In summary, an improved automatic gain control system has been described which exhibits extremely fast attack times.

While a preferred embodiment of the invention has been described in detail, it should be understood that many modifications and variations thereto are possible, all of which fall within the true spirit and scope of the invention.

I claim:
1. An automatic gain control circuit comprising:
   an amplifier means having an input, for receiving a.c. signals, and an output, the amplifier reproducing received signals at its input at said output;
   an attenuator means, coupled to the input of the amplifier means, for attenuating a.c. signal thereat responsive to a control signal; and
   control means, coupled between the amplifier means output and the attenuator means, for sensing both positive and negative transitions of the a.c. signal at the amplifier means output and, in response to the instantaneous peak levels thereof, generating a control signal to control the attenuation of the attenuator means such that said instantaneous peak levels are predeterminedly gain controlled.
2. The automatic gain control circuit of claim 1 wherein the amplifier means includes means to minimize the phase shift thereof.
3. The automatic gain control circuit of claim 1 wherein the automatic means is comprised of a semiconductor device coupled between the amplifier input and a point of low a.c. impedance with respect thereto.
4. The automatic gain control circuit of claim 1 wherein the control means includes a means for minimizing the time to generate a control signal responsive to the level of the a.c. signals at the amplifier means output.
5. The automatic gain control circuit of claim 1 wherein the control means is comprised of a means to control the attenuator means from a low attenuation to a high attenuation state in response to the level of positive or negative a.c. signal transitions, at the amplifier means output, exceeding a predetermined threshold level.
6. A gain control system for a.c. signals comprising:
   a low phase shift amplifier, having input and output terminals:
   a semiconductor attenuator, coupled between the input of the amplifier and a point of low impedance with respect thereto, the attenuator responding to control signals to predeterminedly attenuate a.c. signals at the amplifier input terminal; and
   a level sense control circuit for sensing the instantaneous positive and negative peak level of signals at the amplifier output terminal and generating a predetermined control signal in response thereto such that said instantaneous peak levels are predeterminedly gain controlled.
7. The gain system of claim 6 wherein the level sense control circuit includes means for increasing the attenuation of the attenuator for a.c. signals at the amplifier output whose peak levels exceed a predetermined threshold level.
8. The gain control system of claim 6 wherein the level sense control includes a means to limit the maximum rate of change of the control signal.

* * * * *